United States Patent
Chung et al.

(10) Patent No.: US 9,525,128 B2
(45) Date of Patent: Dec. 20, 2016

(54) SEMICONDUCTOR DEVICES AND METHODS OF MANUFACTURING THE SAME

(71) Applicants: Sungyoon Chung, Seoul (KR); Jinhye Bae, Suwon-si (KR); Hyungjoon Kwon, Seongnam-si (KR); Jongchul Park, Seongnam-si (KR); Wonjun Lee, Seoul (KR)

(72) Inventors: Sungyoon Chung, Seoul (KR); Jinhye Bae, Suwon-si (KR); Hyungjoon Kwon, Seongnam-si (KR); Jongchul Park, Seongnam-si (KR); Wonjun Lee, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/225,401

(22) Filed: Mar. 25, 2014

(65) Prior Publication Data
US 2014/0349413 A1  Nov. 27, 2014

(30) Foreign Application Priority Data
May 22, 2013  (KR) .......................... 10-2013-0057814

(51) Int. Cl.
*H01L 43/12*   (2006.01)
*H01L 21/321*  (2006.01)
*H01L 21/3213* (2006.01)

(52) U.S. Cl.
CPC ..................................... *H01L 43/12* (2013.01)

(58) Field of Classification Search
CPC ...... H01L 43/12; H01L 27/222; H01L 27/228; H01L 43/08; H01L 27/226; H01L 21/0223–21/0224; H01L 21/00
See application file for complete search history.

(56) References Cited

U.S. PATENT DOCUMENTS

| 7,067,016 | B1 | 6/2006  | Mikhaylichenko et al. |
| 7,829,923 | B2 | 11/2010 | Li et al. |
| 8,289,757 | B2 | 10/2012 | Keshtbod et al. |
| 8,491,799 | B2 | 7/2013  | Jung |

(Continued)

FOREIGN PATENT DOCUMENTS

| KR | 20100076557 A | 7/2010 |
| KR | 101222190     | 1/2013 |

*Primary Examiner* — Latanya N Crawford
(74) *Attorney, Agent, or Firm* — Renaissance IP Law Group LLP

(57) ABSTRACT

A method of manufacturing a semiconductor device may include forming a material layer on a substrate, performing a selective oxidation process to form a capping oxide layer on a first surface of the material layer, wherein a second surface of the material layer is not oxidized, and etching the material layer through the second surface to form a material pattern. An etch rate of the capping oxide layer is less than an etch rate of the material layer. A semiconductor device may include a lower electrode on a substrate, a data storage part on a top surface of the lower electrode, an upper electrode on the data storage part, and a capping oxide layer arranged on at least a portion of a top surface of the upper electrode. The capping oxide layer may include an oxide formed by oxidation of an upper surface of the upper electrode.

18 Claims, 17 Drawing Sheets

(56) References Cited

U.S. PATENT DOCUMENTS

| | | | |
|---|---|---|---|
| 2005/0095785 A1* | 5/2005 | Jeon | H01L 27/115 438/257 |
| 2006/0079075 A1* | 4/2006 | Lee | H01L 21/28061 438/587 |
| 2009/0115003 A1* | 5/2009 | Sung | H01L 21/28061 257/412 |
| 2009/0130779 A1 | 5/2009 | Li et al. | |
| 2009/0159563 A1 | 6/2009 | Jung | |
| 2010/0102404 A1 | 4/2010 | Li et al. | |
| 2010/0221848 A1 | 9/2010 | Keshtbod et al. | |
| 2012/0038011 A1* | 2/2012 | Iba | H01L 27/228 257/421 |
| 2012/0086089 A1 | 4/2012 | Li et al. | |
| 2012/0326250 A1 | 12/2012 | Gaidis et al. | |
| 2013/0032907 A1 | 2/2013 | Satoh et al. | |
| 2014/0045336 A1* | 2/2014 | Park | H01L 21/308 438/703 |
| 2015/0028280 A1* | 1/2015 | Sciarrillo | H01L 45/04 257/4 |

* cited by examiner

SEMICONDUCTOR DEVICES AND METHODS OF MANUFACTURING THE SAME

CROSS-REFERENCE TO RELATED APPLICATION

This U.S. non-provisional patent application claims priority under 35 U.S.C. §119 to Korean Patent Application No. 10-2013-0057814, filed on May 22, 2013, in the Korean Intellectual Property Office, the disclosure of which is hereby incorporated by reference in its entirety.

BACKGROUND

The inventive concepts relate to semiconductor devices and methods of manufacturing the same.

Semiconductor devices are widely used in the electronics industry because of their small size, multi-function capabilities, and/or low manufacturing costs. Semiconductor devices may include various kinds of devices, such as semiconductor memory devices storing logic data, logic devices processing logic data, and system-on-chips (SoCs) that provide the functions of both semiconductor memory devices and logic devices. These semiconductor devices may be provided to perform various functions in electronic products. Semiconductor devices have become increasingly integrated with the development of the electronics industry. As integration density increases, the reliability of semiconductor devices may be deteriorated.

SUMMARY

Embodiments of the inventive concepts may provide methods of manufacturing a semiconductor device capable of improving the reliability thereof, despite an increase in integration density.

Embodiments of the inventive concepts may also provide semiconductor devices having excellent reliability.

In one aspect, a method of manufacturing a semiconductor device may include forming a material layer on a substrate and performing a selective oxidation process to form a capping oxide layer on a first surface of the material layer, wherein a second surface of the material layer is not oxidized. The material layer may then be etched through the second surface of the material layer to form a material pattern. An etch rate of the capping oxide layer may be less than an etch rate of the material layer when the material layer is etched.

In some embodiments, the method may further include forming a lower pattern on the substrate before forming the material layer. In this case, the material layer may be formed to cover a top surface and a sidewall of the lower pattern. The first surface of the material layer may cover the top surface of the lower pattern. The second surface of the material layer may cover the sidewall of the lower pattern. The material pattern may be formed on the top surface of the lower pattern.

In some embodiments, the material layer on the top surface of the lower pattern may be thicker than the material layer on the sidewall of the lower pattern.

In some embodiments, the selective oxidation process may be an anisotropic oxidation process having a specific oxidation direction. In this case, the first surface of the material layer may be exposed in the specific oxidation direction and the second surface of the material layer may not be exposed in the specific oxidation direction during the selective oxidation process.

In some embodiments, the material layer may be etched by an isotropic etching process. The isotropic etching process may be a wet etching process.

In another aspect, a method of manufacturing a semiconductor device may include forming a lower electrode on a substrate and forming a conductive layer covering a top surface and a sidewall of the lower electrode. A selective oxidation process may then be performed to form a capping oxide layer on a first surface of the conductive layer, wherein a second surface of the conductive layer is not oxidized, and wherein the first surface and the second surface of the conductive layer cover the top surface and at least a portion of the sidewall of the lower electrode, respectively. The conductive layer may then be etched through the second surface of the conductive layer to form an upper electrode on the top surface of the lower electrode. An etch rate of the capping oxide layer may be less than an etch rate of the conductive layer when the conductive layer is etched.

In some embodiments, the selective oxidation process may be an anisotropic oxidation process having an oxidation direction substantially perpendicular to a top surface of the substrate.

In some embodiments, the anisotropic oxidation process may include at least one of an anisotropic plasma oxidation process or an anisotropic thermal oxidation process.

In some embodiments, the conductive layer may be etched by an isotropic etching process. The isotropic etching process may again be a wet etching process.

In some embodiments, the method may further include forming a data storage layer covering the top surface and the sidewall of the lower electrode before forming the conductive layer. The data storage layer may, for example, be a magnetic memory element or other data storage structure. The conductive layer may be formed on the data storage layer.

In some embodiments, the method may further include forming a protection insulating spacer surrounding the sidewall of the lower electrode before forming the data storage layer.

In some embodiments, forming the protection insulating spacer may include conformally forming a protection insulating layer on the substrate having the lower electrode, and performing an etch-back process on the protection insulating layer to form the protection insulating spacer.

In some embodiments, forming the lower electrode and the protection insulating spacer may instead include forming a mold layer on the substrate and patterning the mold layer to form an opening. The protection insulating spacer may then be formed on an inner sidewall of the opening. The lower electrode may then be formed in the opening having the protection insulating spacer, and the mold layer may then be removed.

In some embodiments, the data storage layer may include a first magnetic layer, a tunnel barrier layer, and a second magnetic layer that are sequentially stacked. One of the first and second magnetic layers may have a magnetization direction fixed in one direction, and the other of the first and second magnetic layers may have a magnetization direction changeable between a direction parallel to and a direction anti-parallel to the fixed magnetization direction.

In some embodiments, the method may further include etching the data storage layer disposed on the sidewall of the lower electrode to form a data storage part, after forming the upper electrode.

In some embodiments, the data storage layer may be etched by an anisotropic etching process having a tilted etching direction with respect to a top surface of the substrate.

In some embodiments, the conductive layer on the top surface of the lower electrode may be thicker than the conductive layer on the sidewall of the lower electrode.

In some embodiments, the conductive layer may be a metal containing layer, and the conductive layer may be etched using an etchant having a pH of between about 5 to about 7.

In still another aspect, a semiconductor device may include a lower electrode on a substrate. A data storage part may be disposed on a top surface of the lower electrode. An upper electrode may be disposed on the data storage part. And a capping oxide layer may be disposed on at least a portion of a top surface of the upper electrode. The capping oxide layer may include an oxide formed by oxidation of the upper electrode.

In some embodiments, an area of a bottom surface of the upper electrode may be less than an area of the top surface of the lower electrode.

In some embodiments, an entire bottom surface of the upper electrode may overlap a center portion of the top surface of the lower electrode.

In some embodiments, an area of a bottom surface of the upper electrode may be less than an area of a top surface of the data storage part.

In some embodiments, the semiconductor device may further include a protection insulating spacer surrounding a sidewall of the lower electrode.

In some embodiments, the data storage part may include a first magnetic pattern, a tunnel barrier pattern, and a second magnetic pattern that are sequentially stacked. One of the first and second magnetic patterns may have a magnetization direction fixed in one direction, and the other of the first and second magnetic patterns may have a magnetization direction changeable between a parallel direction, that is parallel to, and an anti-parallel direction, that is anti-parallel to the fixed magnetization direction.

In some embodiments, the magnetization directions of the first and second magnetic patterns may be substantially perpendicular to a contact surface of the second magnetic pattern and the barrier tunnel pattern.

In some embodiments, the magnetization directions of the first and second magnetic patterns may be substantially parallel to a contact surface of the second magnetic pattern and the barrier tunnel pattern.

In some embodiments, the upper electrode may include a metal and the capping oxide layer may include a metal oxide.

Although several different embodiments have been summarized above, it should be realized that numerous other embodiments are possible without departing from the principles of the inventive concepts disclosed herein. The inventive concepts should therefore be construed to cover all such embodiments.

BRIEF DESCRIPTION OF THE DRAWINGS

The principles of the inventive concepts will become more readily apparent in view of the attached drawings and accompanying detailed description, in which.

DETAILED DESCRIPTION

Figure 1:
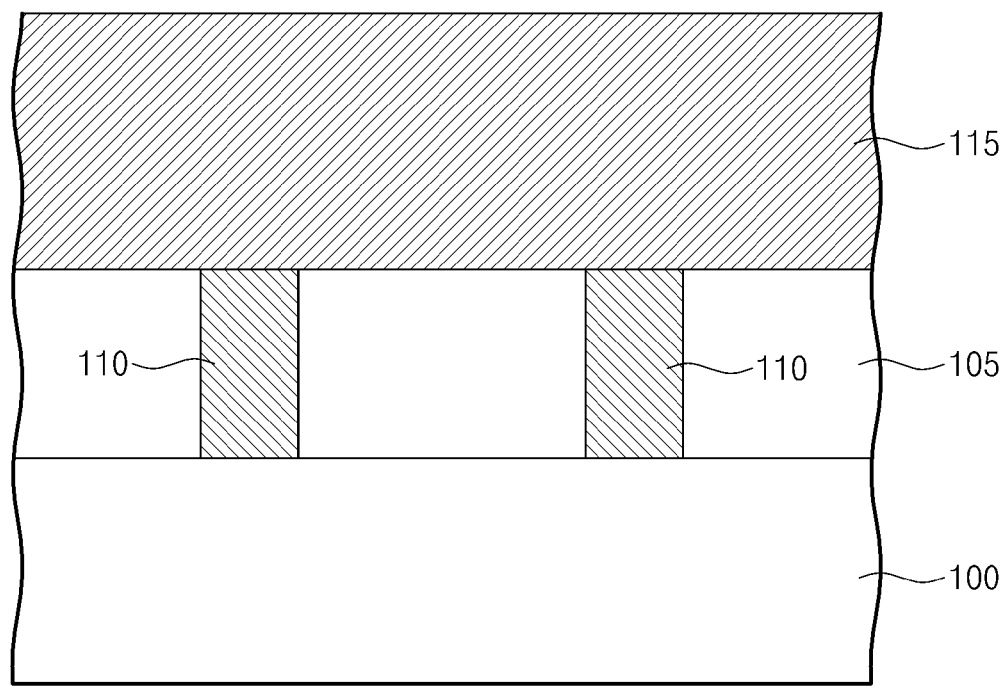
FIGS. 1 to 9 are cross-sectional views illustrating a method of manufacturing a semiconductor device according to example embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be made apparent from the following exemplary embodiments described in detail with reference to the accompanying drawings. It should be noted, however, that the inventive concepts are not limited to the following exemplary embodiments, and may be implemented in various forms. Accordingly, these embodiments are provided simply to disclose the inventive concepts and provide an understanding thereof to those skilled in the art, and should not be considered as limiting the scope of the inventive concepts. In the drawings, embodiments of the inventive concepts are not limited to the specific examples provided herein and may be exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description may be described using sectional views and/or planar illustrations as ideal exemplary views of the inventive concepts. It should be understood that the shapes and sizes of elements and features shown in the exemplary views may be modified according to manufacturing techniques and/or allowable errors. Thus, exemplary embodiments should not be construed as being limited to the shapes and sizes of regions illustrated herein but are to include deviations in shapes that result, for example, from manufacturing processes. Therefore, the elements and features of the inventive concepts are not limited to the specific shapes or sizes illustrated in the exemplary views, but may include other shapes and sizes that may vary, for instance, depending on manufacturing processes.

Moreover, areas exemplified in the drawings have general properties, and are not used to illustrate specific shapes of elements. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments. Thus, the drawings should not be construed as limiting the scope of the inventive concepts.

It will also be understood that although the terms first, second, third, etc., may be used herein to describe various elements, the elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification and drawings.

FIGS. 1 to 9 are cross-sectional views illustrating a method of manufacturing a semiconductor device according to example embodiments of the inventive concepts.

Referring first to FIG. 1, a lower interlayer insulating layer 105 may be formed on a substrate 100. The substrate 100 may include a semiconductor substrate. For example, the substrate 100 may include a silicon substrate, a germanium substrate, or a silicon-germanium substrate. In some embodiments, switching components (not shown) may be formed on the substrate 100, and the lower interlayer insulating layer 105 may be formed to cover the switching components. The switching components may be field effect transistors. Alternatively, the switching components may be diodes. The lower interlayer insulating layer 105 may be a single-layer or multi-layer structure including, for example, an oxide layer (e.g., a silicon oxide layer), a nitride layer (e.g., a silicon nitride layer), and/or an oxynitride layer (e.g., a silicon oxynitride layer).

Lower contact plugs 110 may be formed to penetrate the lower interlayer insulating layer 105. Each of the lower contact plugs 110 may be electrically connected to a terminal of a switching component. The lower contact plugs 110 may, for example, include at least one of a doped semiconductor material (e.g., doped silicon), a metal (e.g., tungsten, titanium, and/or tantalum), a conductive metal nitride (e.g., titanium nitride, tantalum nitride, and/or tungsten nitride), and a metal-semiconductor compound (e.g., a metal silicide).

A lower conductive layer 115 may be formed on the lower interlayer insulating layer 105. The lower conductive layer 115 may be connected to the lower contact plugs 110. For example, the lower conductive layer 115 may be formed of a conductive metal nitride (e.g., titanium nitride or tantalum nitride). However, the inventive concepts are not limited thereto. The lower conductive layer 115 may be formed of another conductive material.

Figure 2:
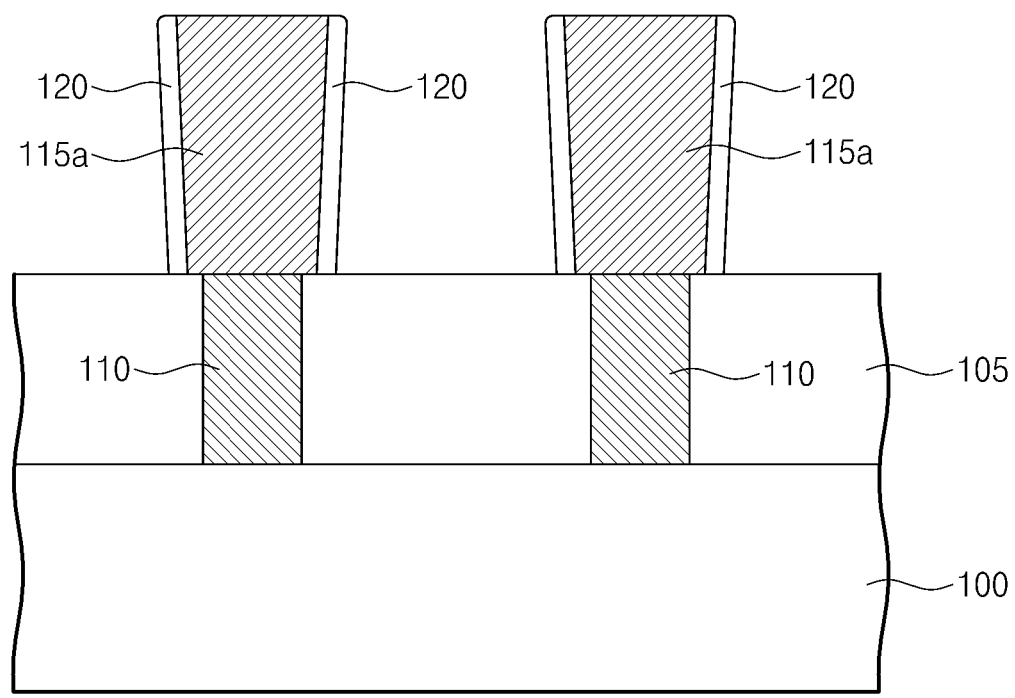

Referring to FIG. 2, the lower conductive layer 115 may be patterned to form lower electrodes 115a. Each of the lower electrodes 115a may be connected to a corresponding one of the lower contact plugs 110. In some embodiments, each of the lower electrodes 115a may have a pillar-shape. However, the inventive concepts are not limited thereto. The shapes of the lower electrodes 115a may be modified.

Subsequently, a protection insulating spacer 120 may be formed to surround a sidewall of each of the lower electrodes 115a. The protection insulating spacer 120 may cover an entire sidewall of the lower electrode 115a. In some embodiments, a protection insulating layer may be conformally formed on the substrate 100 having the lower electrodes 115a and then an etch-back process may be performed on the protection insulating layer until top surfaces of the lower electrodes 115a are exposed. Thus, protection insulating spacers 120 may be formed on the sidewalls of each of the lower electrodes 115a to surround the lower electrodes 115a. The protection insulating spacer 120 is formed of an insulating material. For example, the protection insulating spacer 120 may be formed of a nitride (e.g., silicon nitride) and/or an oxynitride (e.g., silicon oxynitride).

On the other hand, the lower electrodes 115a and the protection insulating spacers 120 may be formed by another method described with reference to FIGS. 10 and 11.

Figure 10:
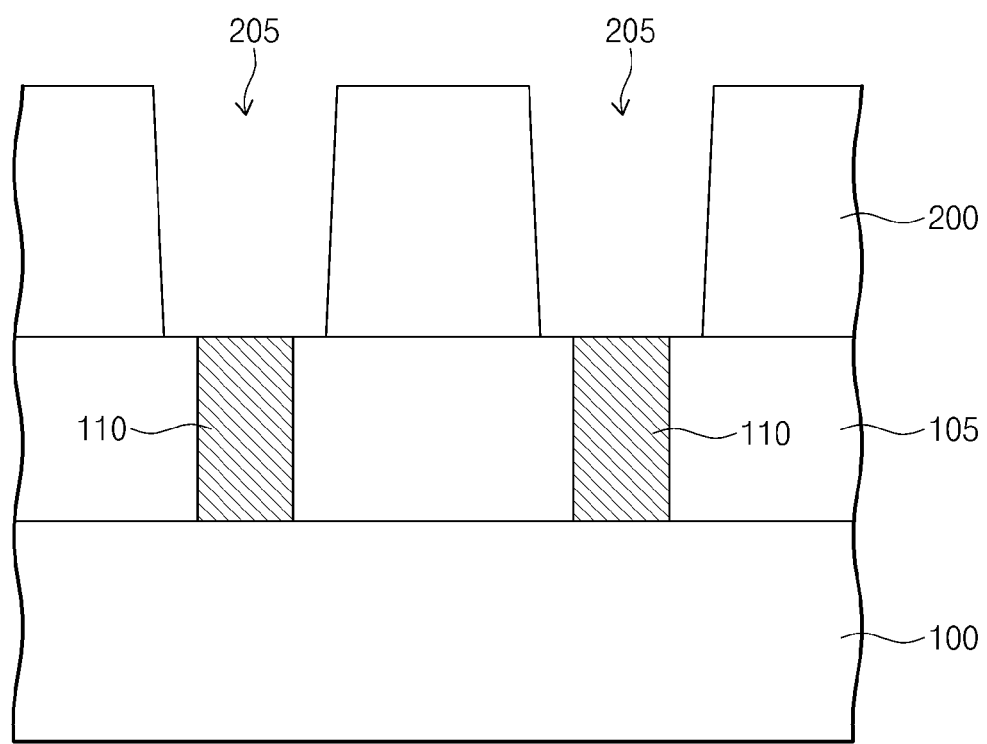
FIGS. 10 and 11 are cross-sectional views illustrating a method of manufacturing a semiconductor device according to alternative example embodiments of the inventive concepts.
Figure 11:
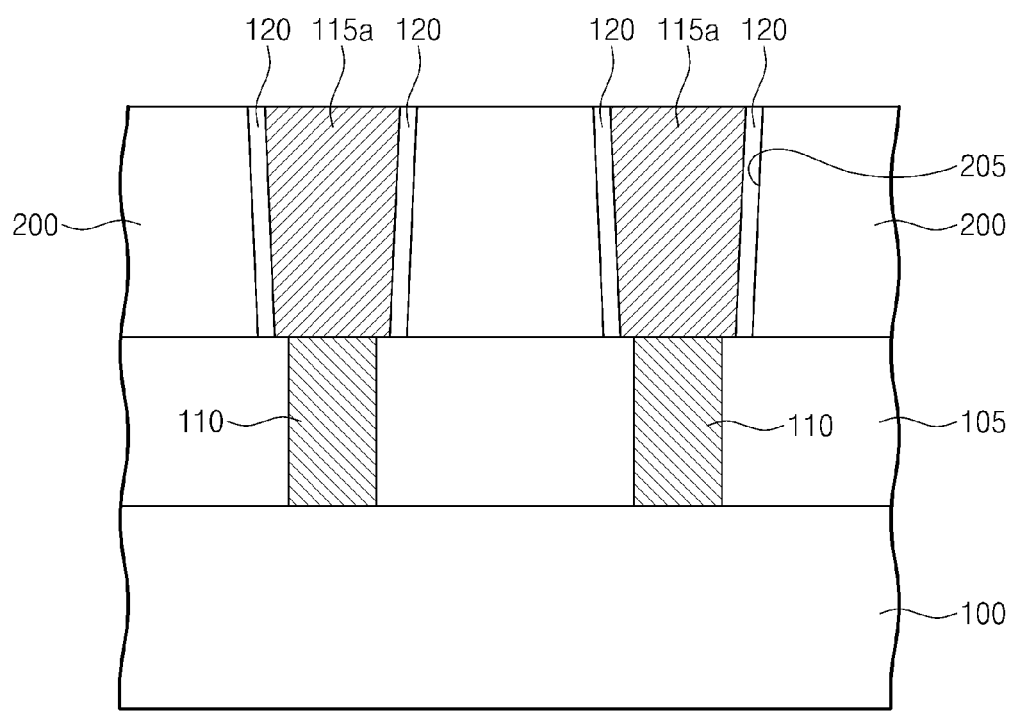

FIGS. 10 and 11 are cross-sectional views illustrating a method of manufacturing a semiconductor device according to a modified example embodiment of the inventive concepts.

Referring to FIG. 10, a mold layer 200 may be formed on the lower interlayer insulating layer 105. At least an upper portion of the lower interlayer insulating layer 105 may have an etch selectivity with respect to the mold layer 200. For example, the lower interlayer insulating layer 105 may include a silicon oxide layer and a silicon nitride layer that are sequentially stacked, and the mold layer 200 may be formed of a silicon oxide layer.

The mold layer 200 may be patterned to form openings 205 exposing the lower contact plugs 110. In some embodiments, the openings 205 may have a circular hole-shape.

Referring now to FIGS. 10 and 11, a protection insulating spacer 120 may be formed on an inner sidewall of each of the openings 205. At this time, the lower contact plugs 110 remain exposed. In some embodiments, the protection insulating layer may be conformally formed on the substrate 100 having the openings 205. An etch-back process may be performed on the protection insulating layer until the mold layer 200 and the lower contact plugs 110 are exposed, thereby forming the protection insulating spacers 120 in the openings 205, respectively. The protection insulating spacers 120 may have an etch selectivity with respect to the mold layer 200. For example, the protection insulating spacers 120 may be formed of silicon nitride, and the mold layer 200 may be formed of a silicon oxide layer.

Subsequently, the lower conductive layer may be formed to fill the openings 205. The lower conductive layer may be connected to the lower contact plugs 110 through the openings 205. The lower conductive layer may be planarized until the mold layer 200 is exposed, thereby forming lower electrodes 115a in the openings 205, respectively.

Next, the mold layer 200 may be removed to form the structure illustrated in FIG. 2.

Since the protection insulating spacers 120 and at least the upper portion of the lower interlayer insulating layer 105 have an etch selectivity with respect to the mold layer 200, they remain on the substrate 100 after removal of the mold layer 200.

Figure 3:
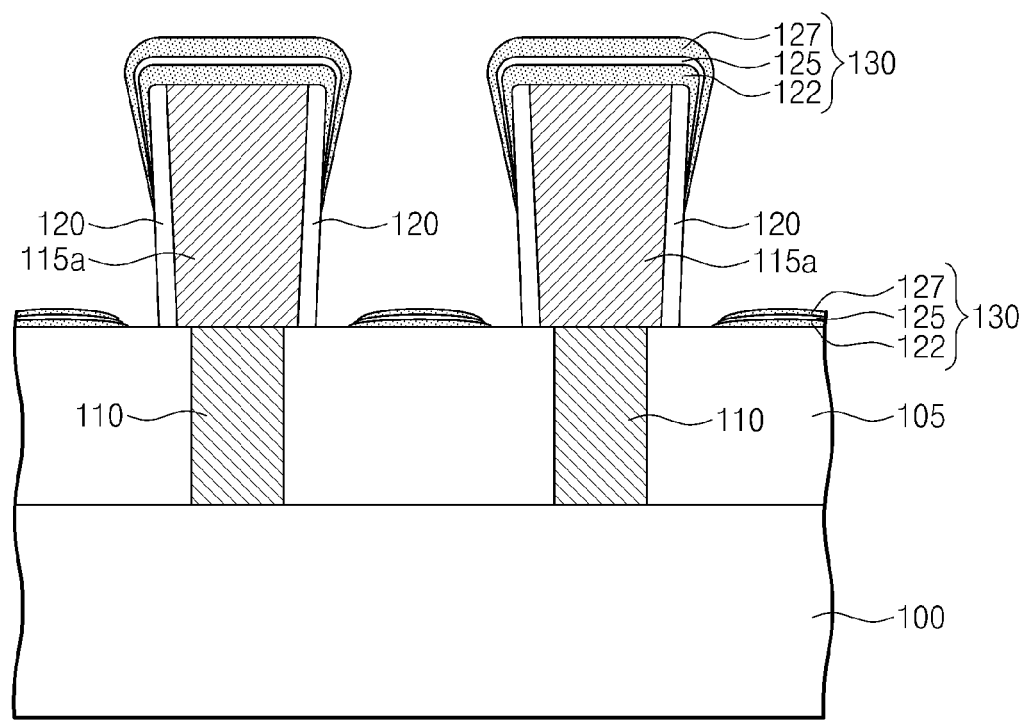

Referring now to FIG. 3, following the formation of the structure shown in FIG. 2, a data storage layer 130 may be formed on the substrate 100 having the lower electrodes 115a and the protection insulating spacers 120. The data storage layer 130 may cover the top surface and at least a portion of a sidewall of the lower electrode 115a. At this time, the data storage layer 130 on the top surface of the lower electrode 115a may be thicker than the data storage layer 130 on the sidewall of the lower electrode 115a. In order to achieve this, the data storage layer 130 may be formed using a physical vapor deposition (PVD) method, or a chemical vapor deposition (CVD) method having a poor step coverage property.

The data storage layer 130 may be in contact with the top surface of the lower electrode 115a. The protection insulating layer 120 may, however, be disposed between the data storage layer 130 and the sidewall of the lower electrode 115a, such that the data storage layer 130 may not be in contact with the sidewall of the lower electrode 115a.

In some embodiments, the data storage layer 130 may also be formed on the lower interlayer insulating layer 105 between the lower electrodes 115a, as illustrated in FIG. 3. The lower electrodes 115a and the protection insulating spacers 120 may completely cover the top surfaces of the lower contact plugs 110. Thus, the data storage layers 130 formed on the lower interlayer insulating layer 105 between the lower electrodes 115a may be completely separated or isolated from the lower contact plugs 110.

In some embodiments, the data storage layer 130 may be a magnetic memory element such as a magnetic tunnel junction layer including a first magnetic layer 122, a tunnel barrier layer 125, and a second magnetic layer 127 that are sequentially stacked. One of the first and second magnetic layers 122 and 127 may correspond to a reference layer having a magnetization direction fixed in one direction, and the other of the first and second magnetic layers 122 and 127 may correspond to a free layer having a magnetization direction that is changeable between a parallel direction, that is parallel to, and an anti-parallel direction, that is anti-parallel to the fixed magnetization direction of the reference layer.

In some embodiments, the magnetization directions of the reference layer and the free layer may be substantially perpendicular to a top surface of the lower electrode 115a. In this case, the reference layer and the free layer may include at least one of a perpendicular magnetic material (e.g., CoFeTb, CoFeGd, and/or CoFeDy), a perpendicular magnetic material having an $L1_0$ structure, CoPt having a hexagonal close packed (HCP) lattice structure, and a perpendicular magnetic structure. The perpendicular magnetic material having the $L1_0$ structure may include at least one of FePt of the $L1_0$ structure, FePd of the $L1_0$ structure, CoPd of the $L1_0$ structure, or CoPt of the $L1_0$ structure. The perpendicular magnetic structure may include magnetic layers and non-magnetic layers which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n (where n is the number of times the magnetic layer and the non-magnetic layer are stacked). The reference layer may be thicker than the free layer, and/or a coercive force of the reference layer may be greater than a coercive force of the free layer.

In other embodiments, the magnetization directions of the reference layer and the free layer may be substantially parallel to the top surface of the lower electrode 115a. In this case, the reference layer and the free layer may include a ferromagnetic material. The reference layer may further include an antiferromagnetic material for pinning a magnetization direction of the ferromagnetic material included in the reference layer.

The tunnel barrier layer 125 may include at least one of a magnesium oxide (MgO) layer, a titanium oxide (TiO) layer, an aluminum oxide (AlO) layer, a magnesium-zinc oxide (MgZnO) layer, or a magnesium-boron oxide (MgBO) layer.

Each of the first magnetic layer 122, the tunnel barrier layer 125, and the second magnetic layer 127 may be formed, for example, by a PVD method or a CVD method having a poor step coverage property. Thus, each of the layers 122, 125, and 127 on the top surface of the lower electrode 115a may be thicker than each of the layers 122, 125, and 127 on the sidewall of the lower electrode 115a.

As described above, the data storage layer 130 may be a magnetic tunnel junction layer. However, the inventive concepts are not limited thereto. According to other embodiments of the inventive concepts, for example, the data storage layer 130 may include a transition metal oxide layer. At least one electrical path may be generated in or be removed from the transition metal oxide layer by a program or erase operation, respectively. The electrical path may, for example, be vacancies connected to each other or metal atoms connected to each other. Thus, a resistance of the transition metal oxide layer may be changed by the generation and/or disappearance of the electrical path, such that the transition metal oxide layer may store logic data. If the data storage layer 130 includes the transition metal oxide layer, the data storage layer 130 may be a single-layer or a multi-layer structure. For example, the transition metal oxide layer may include at least one of niobium oxide, titanium oxide, nickel oxide, zirconium oxide, vanadium oxide, PCMO((Pr,Ca)MnO3), strontium-titanium oxide, barium-strontium-titanium oxide, strontium-zirconium oxide, barium-zirconium oxide, or barium-strontium-zirconium oxide.

Hereinafter, an example embodiment of the data storage layer 130 of the magnetic tunnel junction layer will be described.

Figure 4:
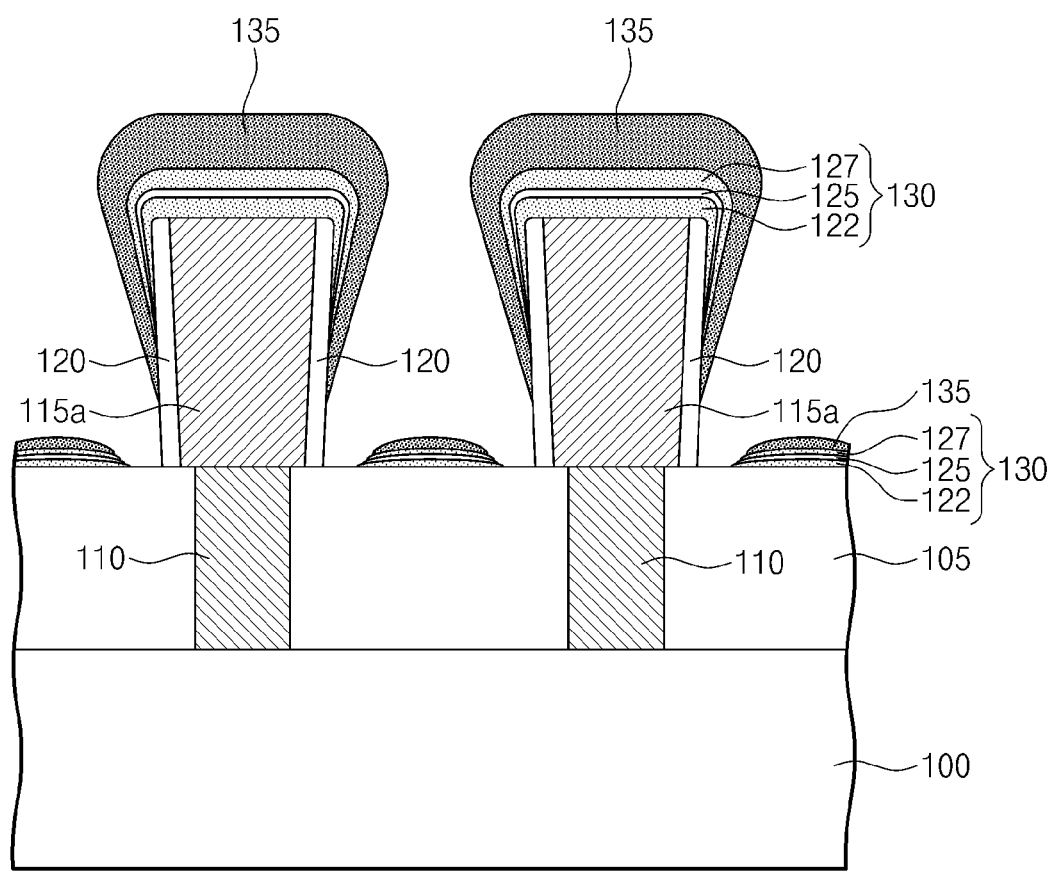

Referring to FIG. 4, an upper conductive layer 135 may be formed on the substrate 100 having the data storage layer 130. The upper conductive layer 135 may cover the top surface and at least a portion of the sidewall of each lower electrode 115a. At this time, the upper conductive layer 135 on the top surface of the lower electrode 115a may be thicker than the upper conductive layer 135 on the sidewall of the lower electrode 115a. In some embodiments, the upper conductive layer 135 on the top surface of the lower electrode 115a may be about three or more times thicker than the upper conductive layer 135 on the sidewall of the lower electrode 115a. The upper conductive layer 135 may be formed, for example, by a PVD method or a CVD method having a poor step coverage property.

The upper conductive layer 135 may cover the data storage layer 130 disposed on the top surface of the lower electrode 115a. Additionally, the upper conductive layer 135 may cover the data storage layer 130 disposed on the sidewall of the lower electrode 115a. Moreover, the upper conductive layer 135 may be partially formed on the lower interlayer insulating layer 105 between the lower electrodes 115a.

In some embodiments, the upper conductive layer 135 may be a metal containing layer. For example, the upper conductive layer 135 may include at least one of tungsten, titanium, tantalum, aluminum, and metal nitrides (e.g., titanium nitride and tantalum nitride).

Figure 5:
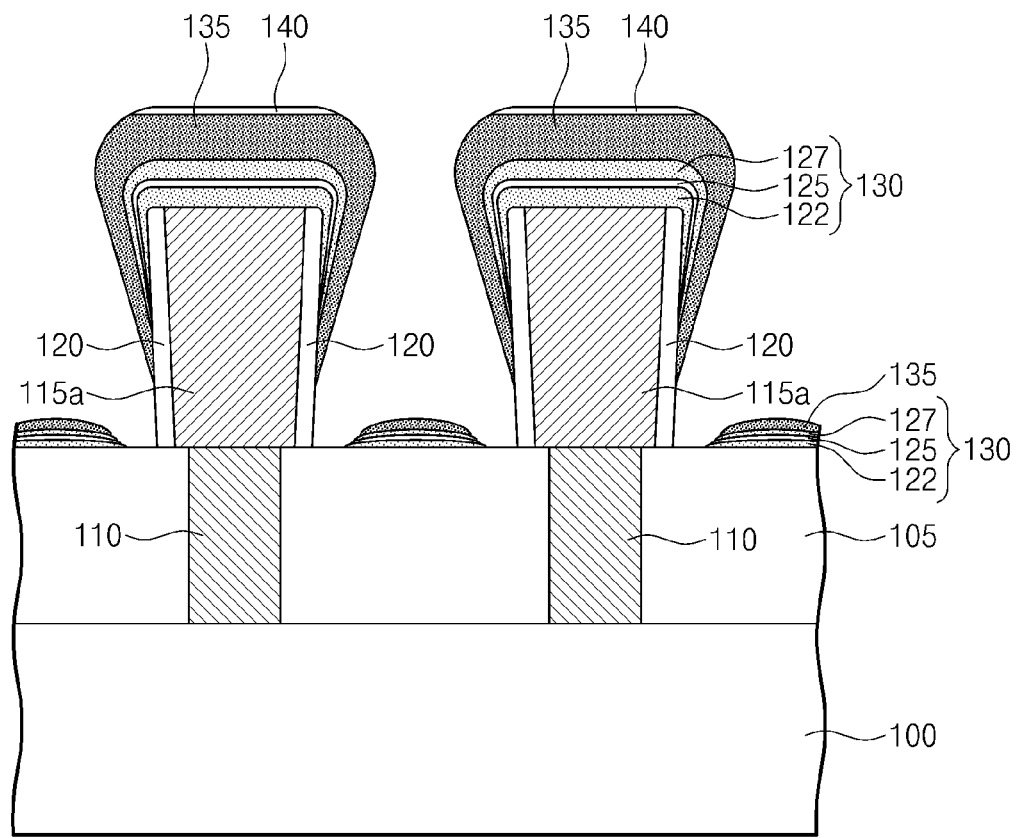

Referring to FIG. 5, a selective oxidation process may be performed on the upper conductive layer 135 on the top surface of the lower electrode 115a, thereby forming a capping oxide layer 140 on at least a portion of an upper or first surface of the upper conductive layer 135. More particularly, the upper conductive layer 135 may have an exposed surface when the selective oxidation process is performed. The exposed surface of the upper conductive layer 135 may have a first surface and a second surface. Using the selective oxidation process, the capping oxide layer 140 may be formed on the first surface of the upper conductive layer 135 while the second surface of the upper conductive layer 135 may not be oxidized. The capping oxide layer 140 may have an etch selectivity with respect to the upper conductive layer 135.

The selective oxidation process may be an anisotropic oxidation process having a specific oxidation direction. When the anisotropic oxidation process is performed, the first surface of the upper conductive layer 135 is exposed in the specific oxidation direction but the second surface of the upper conductive layer 135 is not exposed in the specific oxidation direction. Thus, the first surface of the capping layer 135 is oxidized to form the capping oxide layer 140, but the second surface of the upper conductive layer 135 is not oxidized.

In some embodiments, the specific oxidation direction of the anisotropic oxidation process may be substantially perpendicular to the top surface of the substrate 100. In this case, as illustrated in FIG. 5, the first surface of the upper conductive layer 135 may cover the entire top surface of the lower electrode 115a, and the second surface of the upper conductive layer 135 may cover at least a portion of the sidewall of the lower electrode 115a.

Additionally, the second surface of the upper conductive layer 135 may cover at least a portion of the data storage layer 130 that covers the sidewall of the lower electrode 115a.

The capping oxide layer 140 is formed having a thin structure, so that an upper conductive layer 135 having a sufficient thickness remains between the capping oxide layer 140 and the data storage layer 130 on the top surface of the lower electrode 115a.

As explained above, the first surface of the upper conductive layer 135 is oxidized to form the capping oxide layer 140. Thus, the capping oxide layer 140 includes the same element as the upper conductive layer 135. For example, if the upper conductive layer 135 is a metal containing layer, the capping oxide layer 140 includes the same metal as the upper conductive layer 135. More particularly, if the upper conductive layer 135 is a tungsten layer, the capping oxide layer 140 may be formed of tungsten oxide.

The anisotropic oxidation process used to form the capping oxide layer 140 may, for example, be an anisotropic plasma oxidation process or an anisotropic thermal oxidation process. In the anisotropic plasma oxidation process, oxygen ions may be provided along the specific oxidation direction (e.g., the direction perpendicular to the top surface of the substrate 100) by a back bias applied to a chuck disposed under the substrate 100. Thus, the capping oxide layer 140 may be selectively formed on the first surface of the upper conductive layer 135. On the other hand, the anisotropic thermal oxidation process may use a laser annealing method. For example, a laser beam may be irradiated in the specific oxidation direction under an oxygen atmosphere. Thus, the capping oxide layer 140 may be formed on the first surface of the upper conductive layer 135 to which the laser beam is irradiated. On the contrary, since the laser beam is not irradiated to the second surface of the upper conductive layer 135, the capping oxide layer 140 is not formed on the second surface of the upper conductive layer 135.

The anisotropic oxidation process may use an oxygen source gas including, for example, an oxygen ($O_2$) gas, an ozone ($O_3$) gas, water vapor ($H_2O$), and/or a nitrous oxide ($N_2O$) gas.

Figure 6:
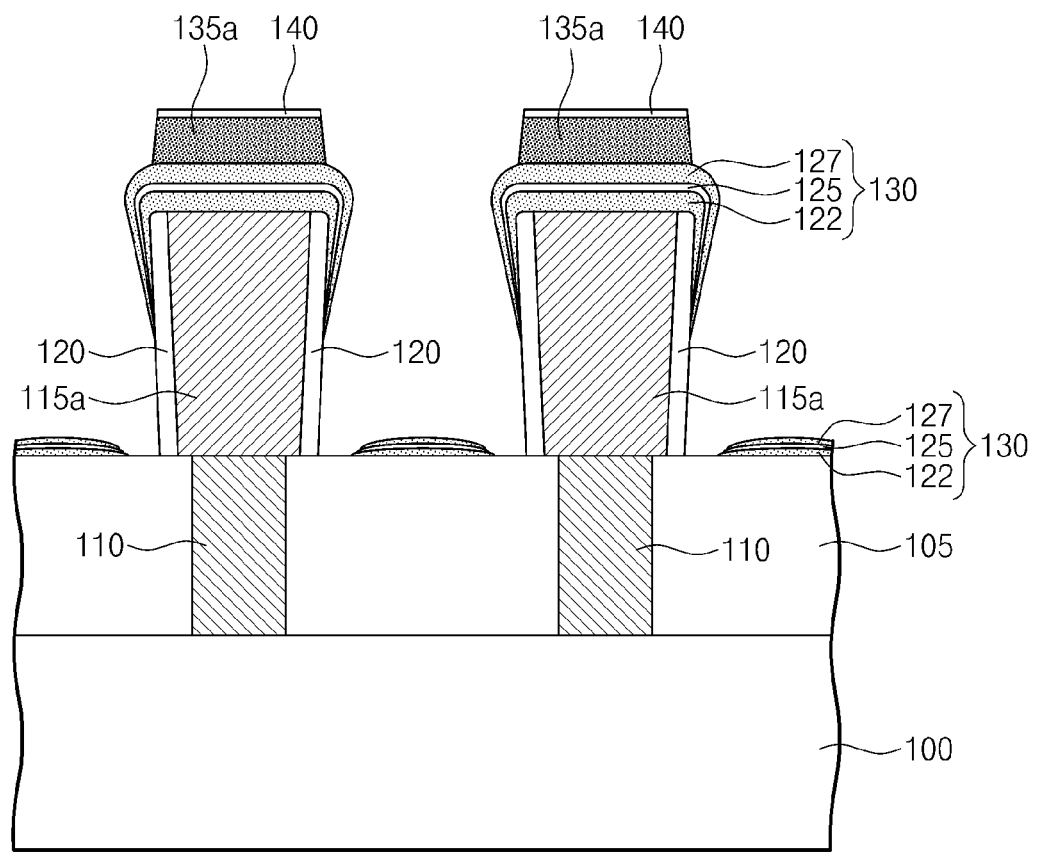

Referring to FIG. 6, the upper conductive layer 135 may be etched through the second surface of the upper conductive layer 135, thereby forming an upper electrode 135a.

In other words, the second surface of the upper conductive layer 135 may be removed through an etching process to form the upper electrode 135a. When the upper conductive layer 135 is etched, the capping oxide layer 140 may be used as an etch mask. In other words, an etch rate of the capping oxide layer 140 may be less than an etch rate of the upper conductive layer 135 when the upper conductive layer 135 is etched.

The upper conductive layer 135 may, for example, be etched by an isotropic etching process. In some embodiments, the isotropic etching process of the upper conductive layer 135 may be a wet etching process using an etchant. In some embodiments, the upper conductive layer 135 may be a metal containing layer and the etchant may include diluted oxygenated water, a standard cleaning 1 (SC1) solution, deionized water including ozone, or diluted ammonia water. The SC1 solution may include ammonia, hydrogen peroxide, and deionized water. In some embodiments, the etchant may have a pH of between about 5 to about 7 in order to increase a difference between the etch rate of a metal containing upper conductive layer 135 (e.g., a tungsten layer) and the etch rate of the capping oxide layer 140. In other words, the etch rate of the upper conductive layer 135 may be sufficiently greater than the etch rate of the capping oxide layer 140 when an etchant is selected having a pH of between about 5 to about 7.

As described above, the isotropic etching process for etching the upper conductive layer 135 may be a wet etching process. However, the inventive concepts are not limited thereto. According to other embodiments, the isotropic etching process for etching the upper conductive layer 135 may be a dry isotropic etching process. The dry isotropic etching process may use an etching gas.

The upper electrode 135a may be formed on the data storage layer 130 disposed on the top surface of the lower electrode 115a. The upper electrode 135a may thereby also be disposed over the top surface of the lower electrode 115a and the data storage layer 130 on the sidewall of the lower electrode 115a may be exposed.

After the upper electrode 135a is formed by the isotropic etching process, the capping oxide layer 140 may remain as illustrated in FIG. 6. However, the inventive concepts are not limited thereto. The capping oxide layer 140 may instead be removed by the isotropic etching process. However, even in this case, the capping oxide layer 140 is used as an etch mask so that the upper electrode 135 retains a sufficient thickness to function as an electrode.

If the capping oxide layer 140 is not formed, even though the upper conductive layer on the top surface of the lower electrode is thicker than the conductive layer on the sidewall of the lower electrode, the upper conducive layer on the top surface of the lower electrode may be substantially removed through the isotropic etching process. This may be at least partially due to a grain size of the thick upper conductive layer being greater than a grain size of the thin upper conductive layer.

However, in embodiments of the inventive concepts, the capping oxide layer 140 is selectively formed on the exposed upper conductive layer 135 and the isotropic etching process is performed using the capping oxide layer 140 as an etch mask. Thus, the upper electrode 135a may be formed having a sufficient thickness to function properly.

The upper conductive layer 135 on the lower interlayer insulating layer 105 between the lower electrodes 115a may be removed by the isotropic etching process.

Figure 7:
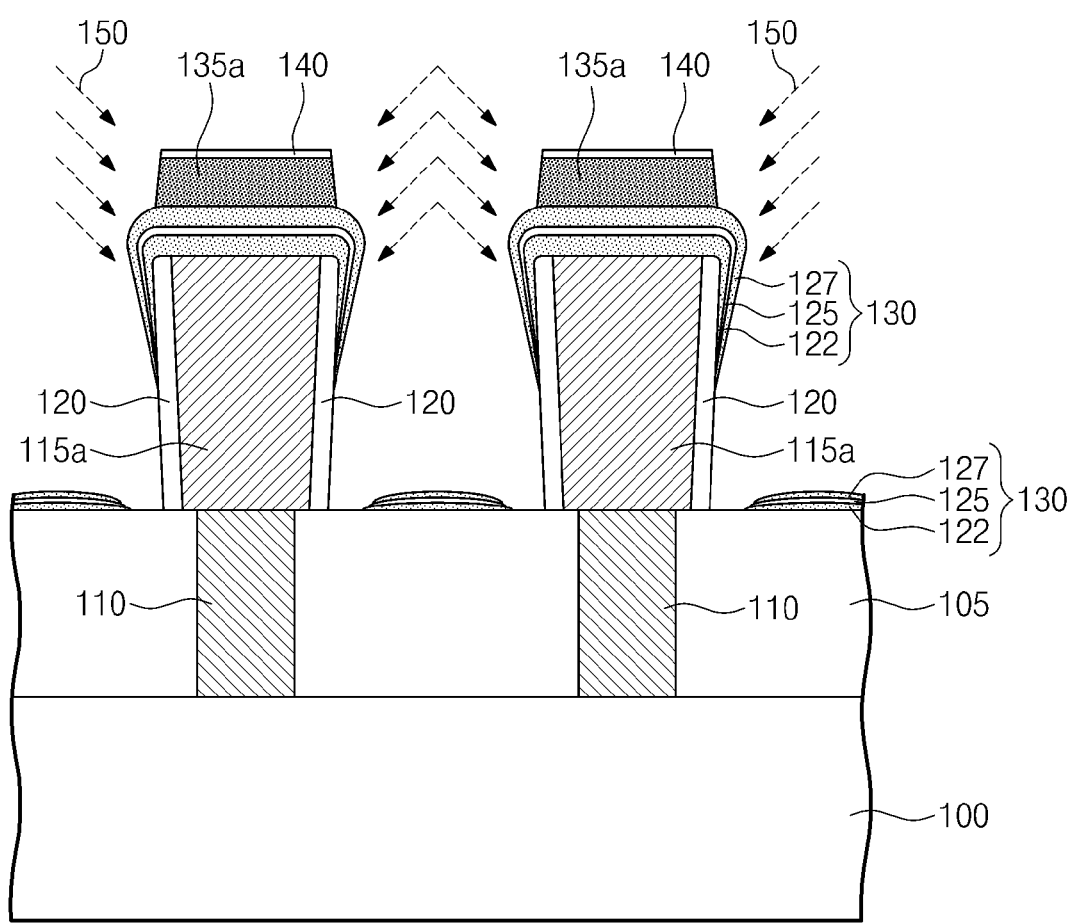
Figure 8:
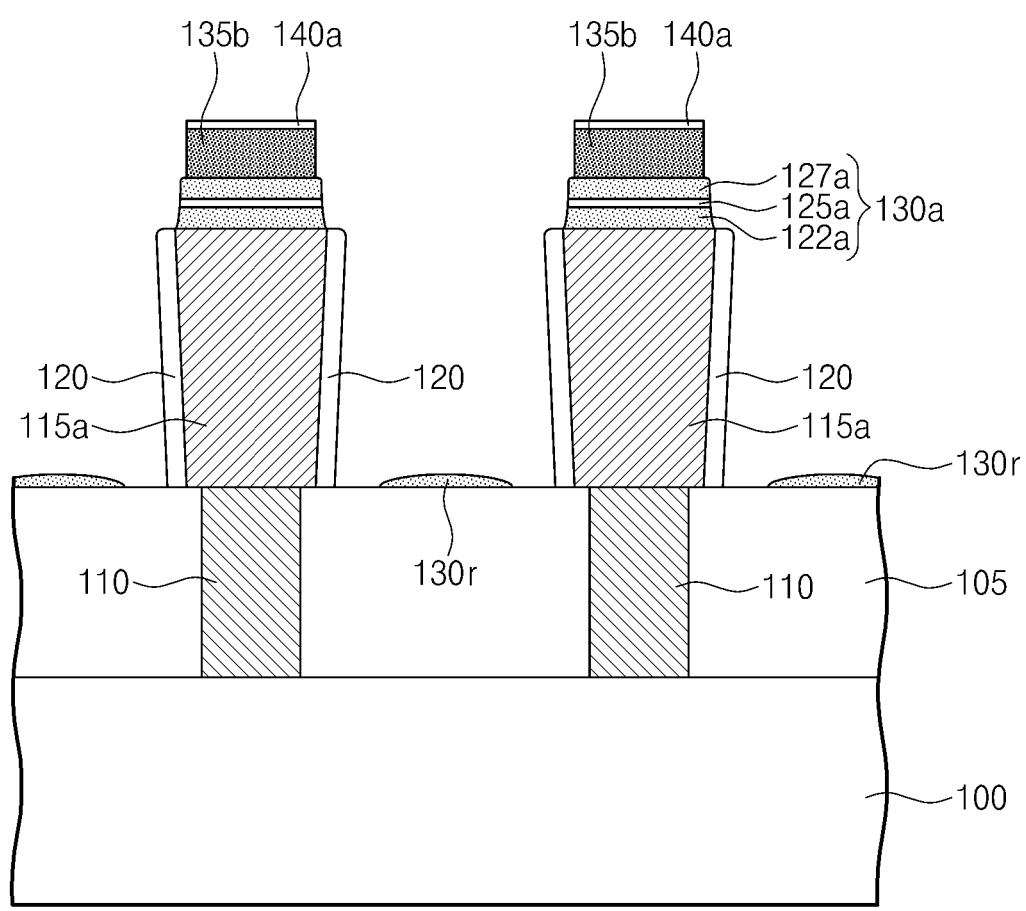

Referring to FIGS. 7 and 8, the exposed data storage layer 130 may be etched to form a data storage part 130a. More particularly, the exposed data storage layer 130 may be disposed on at least a portion of the sidewall of the lower electrode 115a. Thus, the exposed data storage layer 130 may be etched using an anisotropic etching process having a slanted or tilted etching direction 150 with respect to the top surface of the substrate 100, as illustrated by the dashed arrows in FIG. 7. As a result, the data storage part 130a may be formed on the top surface of the lower electrode 115a, as illustrated in FIG. 8. The data storage part 130a may be formed to be confined to the top surface of the lower electrode 115a.

As mentioned above, if the data storage layer 130 is a magnetic tunnel junction layer, the first and second magnetic layers 122 and 127 of the data storage layer 130 may be separated from each other by the anisotropic etching process. In this case, the data storage part 130a may include a first magnetic pattern 122a, a tunnel barrier pattern 125a, and a second magnetic pattern 127a that are sequentially stacked.

The anisotropic etching process of the data storage layer 130 may, for example, be a sputtering etching process. Thus, the upper electrode 135a and the capping oxide layer 140 of FIG. 7 may be partially etched by the anisotropic etching process. Accordingly, in FIG. 8, the reference designator "135b" indicates the upper electrode 135b etched by the anisotropic etching process, and a reference designator "140a" indicates the capping oxide layer 140a etched by the anisotropic etching process. When the anisotropic etching process is performed, the protection insulating spacer 120 may protect the lower electrode 115a from being etched. As a result, an area of a bottom surface of the upper electrode 135b may be less than an area of the top surface of the lower electrode 115a. In some embodiments, the area of the bottom surface of the upper electrode 135b may also be less than an area of a top surface of the data storage part 130a.

As illustrated in FIG. 8, a residual data storage layer 130r may remain on the lower interlayer insulating layer 105 between the lower electrodes 115a. The residual data storage layer 130r may include the same material as at least the first magnetic pattern 122a.

Figure 9:
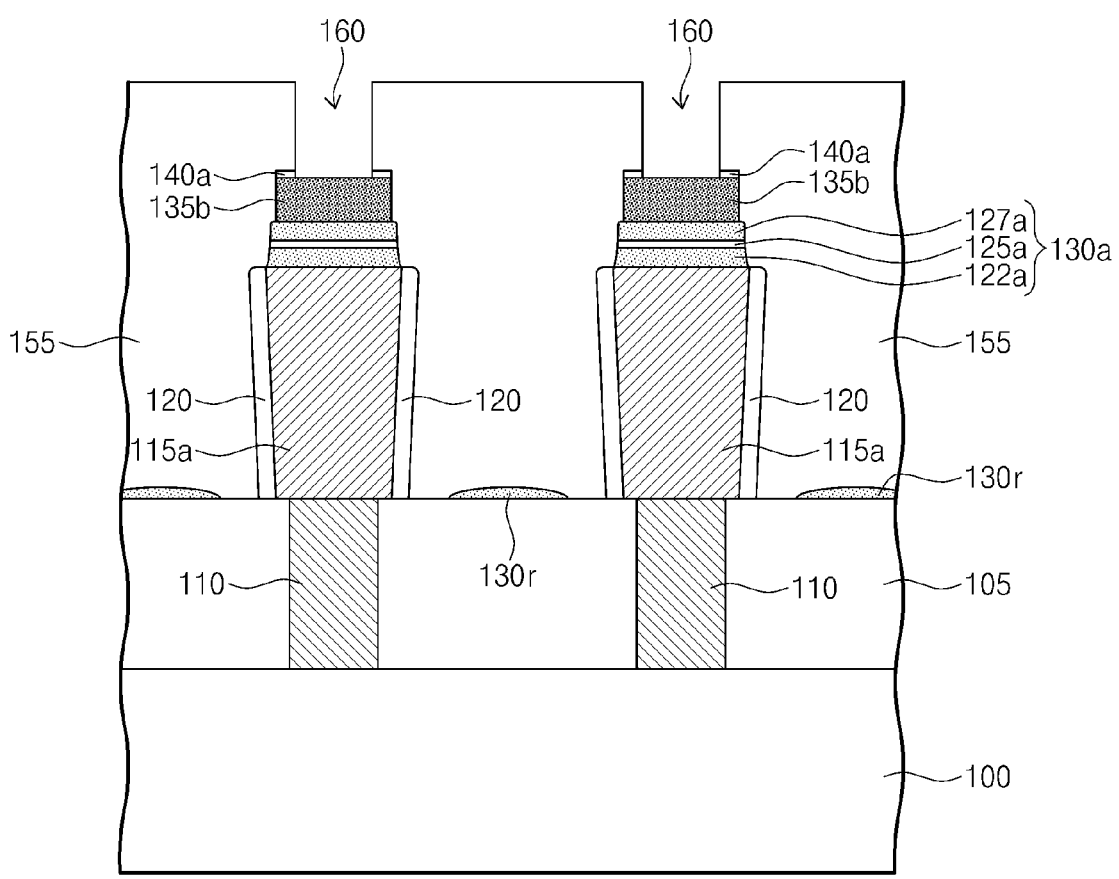

Referring next to FIG. 9, an upper interlayer insulating layer 155 may then be formed on an entire surface of the substrate 100. The upper interlayer insulating layer 155 may cover the lower electrodes 115a, the protection insulating spacers 120, the data storage parts 135b, the upper electrodes 135b, and the capping oxide layers 140a. A top surface of the upper interlayer insulating layer 155 may be planarized. The upper interlayer insulating layer 155 may be a single-layer or a multi-layer structure. For example, the upper interlayer insulating layer 155 may include an oxide layer (e.g., a silicon oxide layer), a nitride layer (e.g., a silicon nitride layer), and/or an oxynitride layer (e.g., a silicon oxynitride layer).

The upper interlayer insulating layer 155 and the capping oxide layers 140a may be successively patterned to form upper contact holes 160 that expose the upper electrodes 135b. A portion of the capping oxide layer 140a may remain on a portion (e.g., edge portions) of the top surface of the upper electrode 135b following the patterning process.

Figure 12:
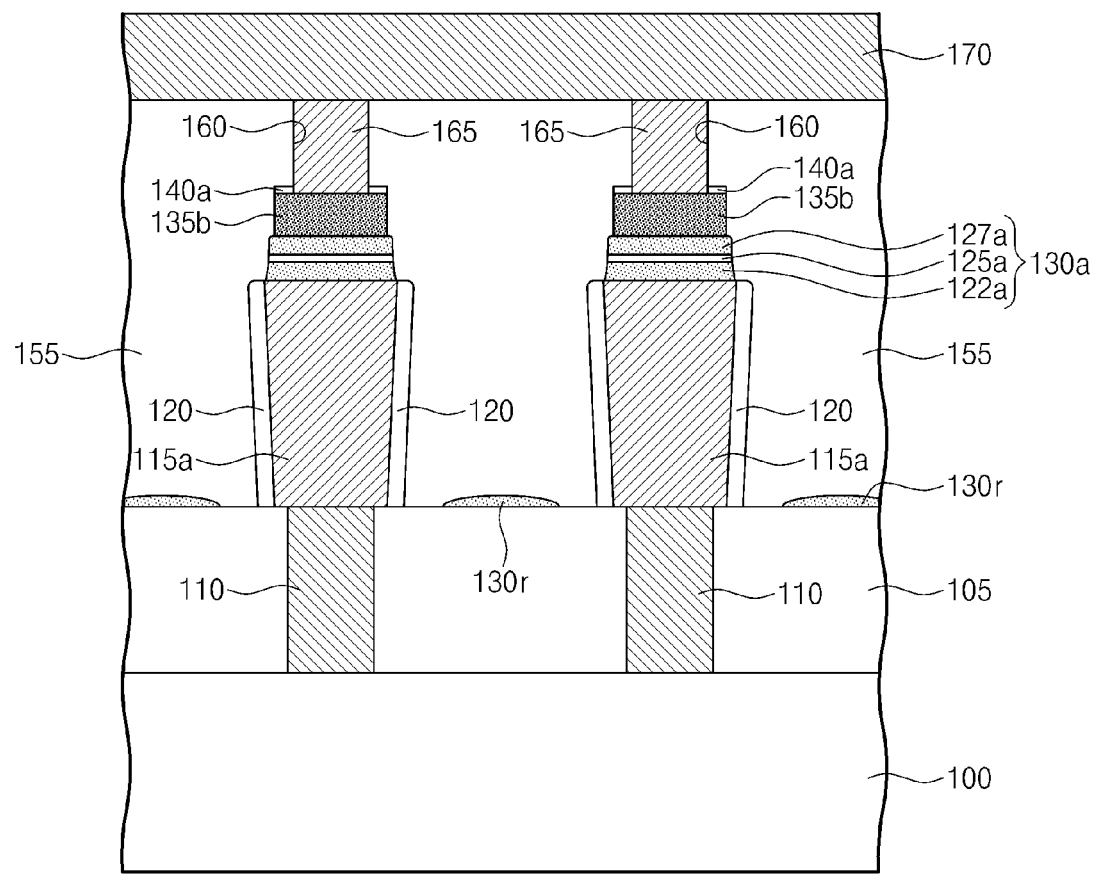
FIG. 12 is a cross-sectional view illustrating a semiconductor device constructed according to an example embodiment of the inventive concepts.

Subsequently, as illustrated in FIG. 12, upper contact plugs 165 may be formed to fill the upper contact holes 160, and an interconnection 170 may then be formed on the upper interlayer insulating layer 155. The interconnection 170 may extend in one direction and may be connected to each of the upper contact plugs 165 arranged in that direction. In some embodiments, the interconnection 170 may, for instance, perform a bit line function.

According to embodiments of the inventive concepts as described above, the upper conductive layer 135 may be formed to cover the top surface and at least a portion of the sidewall of the lower electrode 115a. A selective oxidation process may then be performed to form the capping oxide layer 140 on the first surface of the upper conductive layer 135. The upper conductive layer 135 may then be etched through the second surface of the upper conductive layer 135 using the capping oxide layer 140 as an etch mask, thereby forming the upper electrode 135a on the top surface of the lower electrode 115a. The upper electrode 135a may be formed having a sufficient thickness to act as an electrode due to the capping oxide layer 140. Thus, the upper electrodes 135a may thereby be configured to sufficiently perform their desired function.

Additionally, the capping oxide layer 140 may be formed using an anisotropic oxidation process as the selective oxidation process. Thus, the formation process of the capping oxide layer 140 may be simplified to improve productivity in manufacturing the semiconductor device. For example, due to the anisotropic oxidation process, the capping oxide layer 140 may be formed to be self-aligned without requiring a photolithography process.

Moreover, the protection insulating spacer 120 may surround the sidewall of the lower electrode 115a. The protection insulating spacer 120 may thereby protect the lower electrode 115a from the process of etching the upper conductive layer 135 and the process of etching the data storage layer 130. Additionally, even though a residual data storage layer 130r may remain between the lower electrodes 115a, the protection insulating spacer 120 can further isolate the lower electrode 115a from the residual data storage layer 130r to prevent reliability of the semiconductor device from being deteriorated.

A semiconductor device constructed according to embodiments of the inventive concepts will now be described in further detail with reference to the drawings.

Figure 13:
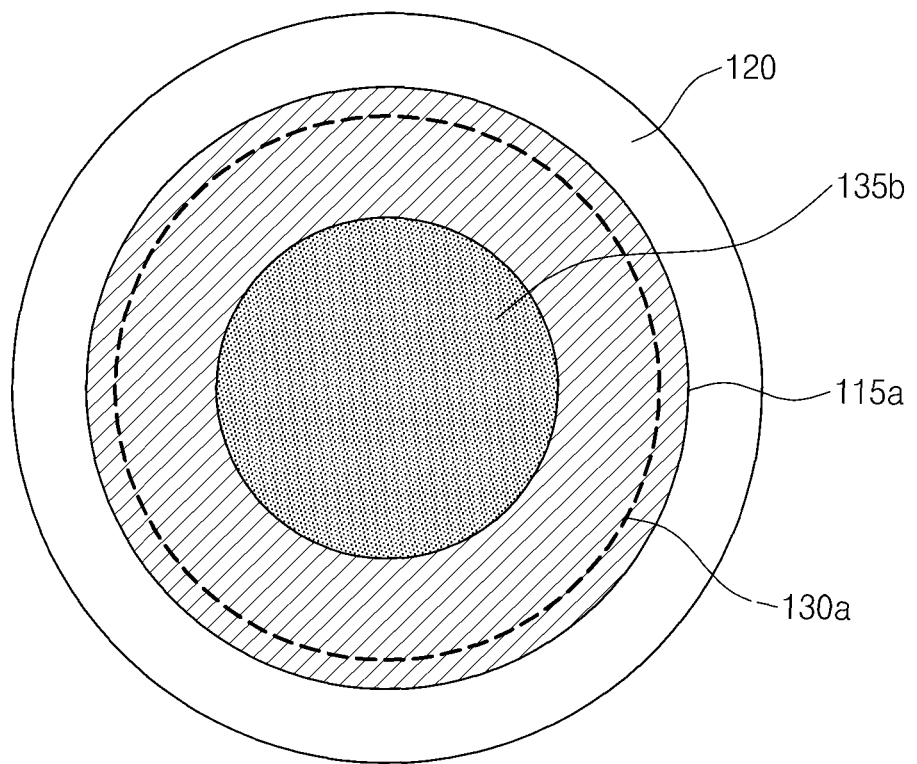
FIG. 13 is a plan view illustrating an upper electrode and a lower electrode of a semiconductor device constructed according to an example embodiment of the inventive concepts.
Figure 14:
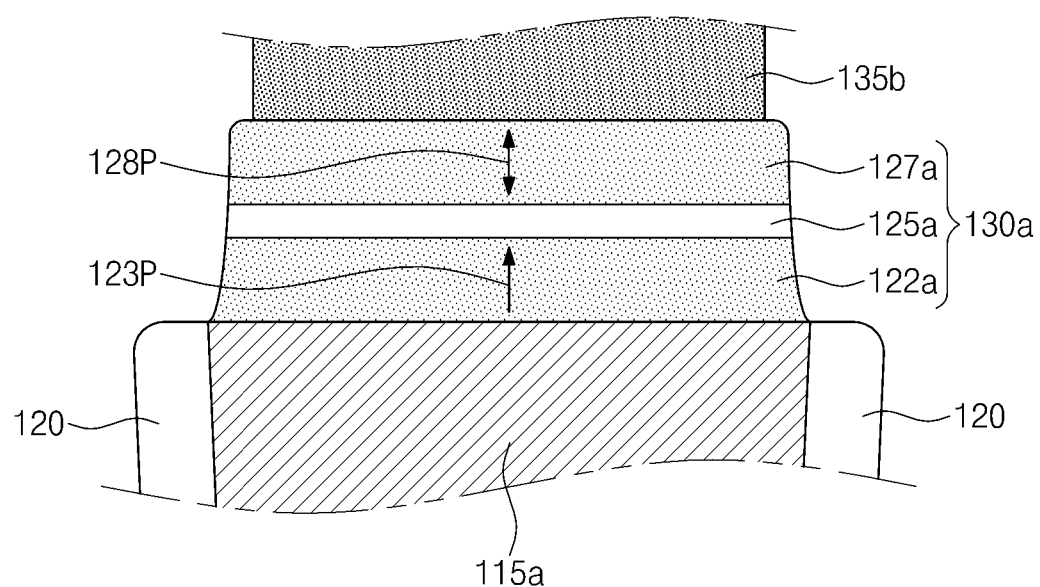
FIG. 14 is a cross-sectional view illustrating a data storage part of a semiconductor device constructed according to an example embodiment of the inventive concepts.
Figure 15:
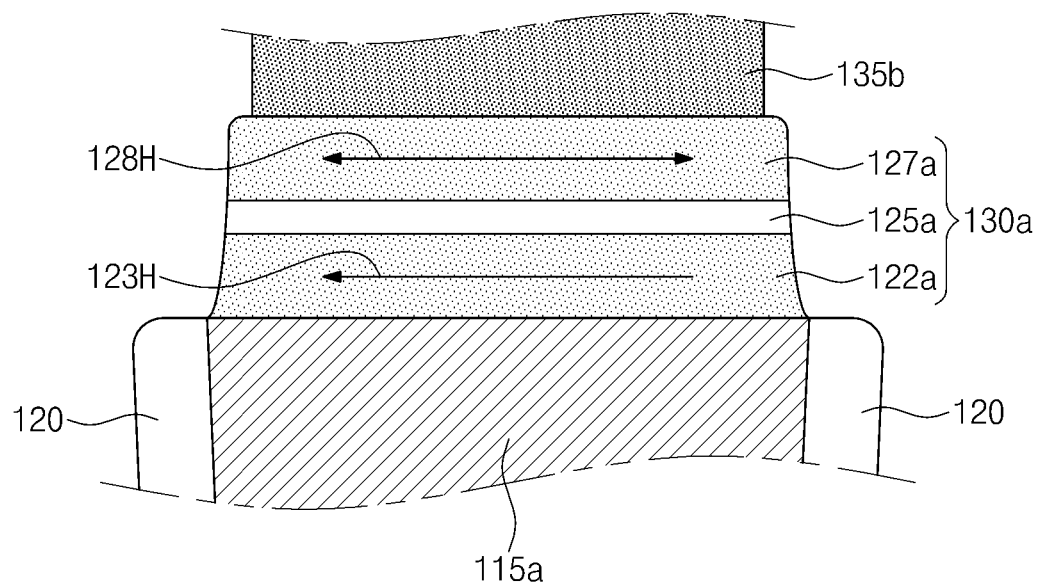
FIG. 15 is a cross-sectional view illustrating a data storage part of a semiconductor device according to another example embodiment of the inventive concepts.

FIG. 12 is a cross-sectional view illustrating a semiconductor device constructed according to example embodiments of the inventive concepts. FIG. 13 is a plan view illustrating an upper electrode and a lower electrode of a semiconductor device constructed according to example embodiments of the inventive concepts. FIG. 14 is a cross-sectional view illustrating a data storage part of a semiconductor device constructed according to example embodiments of the inventive concepts. And FIG. 15 is a cross-sectional view illustrating a data storage part of a semiconductor device constructed according to another example embodiment of the inventive concepts;

Referring first to FIGS. 12 and 13, a semiconductor device may include a lower interlayer insulating layer 105 disposed on a substrate 100. The lower interlayer insulating layer 105 may, for example, cover switching components (not shown) formed on the substrate 100. Lower contact plugs 110 may penetrate the lower interlayer insulating layer 105. Each of the lower contact plugs 110 may be electrically connected to a terminal of a switching component.

Lower electrodes 115a may be disposed on the lower interlayer insulating layer 105. The lower electrodes 115a may each be connected to a top surface of one of the lower contact plugs 110. A protection insulating spacer 120 may surround a sidewall of each of the lower electrodes 115a. In some embodiments, the protection insulating spacer 120 may surround substantially all of or an entire sidewall of the lower electrode 115a. The lower electrode 115a and the protection insulating spacer 120 surrounding the lower electrode 115a may completely cover a top surface of the lower contact plug 110.

The lower electrode 115a may be formed of a conductive material. For example, the lower electrode 115a may include a conductive metal nitride (e.g., titanium nitride or tantalum nitride). The protection insulating spacer 120 may include an insulating material such as a nitride (e.g., silicon nitride) and/or an oxynitride (e.g., silicon oxynitride).

A data storage part 130a may be disposed on the top surface of each of the lower electrodes 115a. In some embodiments, the data storage part 130a may be confined to the top surface of the lower electrode 115a. The data storage part 130a may store logic data. The data storage part 130a may store the logic data by various operation principles. The data storage part 130a will be described in additional detail later.

An upper electrode 135b may be disposed on a top surface of each of the data storage parts 130a. In other words, the data storage part 130a may be disposed between the lower electrode 115a and the upper electrode 135b. The capping oxide layer 140a may be disposed on a portion of the top surface of the upper electrode 135b.

The capping oxide layer 140a may include an oxide formed by oxidation of the upper electrode 135b. In other words, the capping oxide layer 140a may include the same element as the upper electrode 135b. For instance, in some embodiments, the upper electrode 135b may include a metal containing material. In this case, the capping oxide layer 140a may include a metal oxide including the same metal element as the upper electrode 135b. Where the upper electrode 135b includes at least one of tungsten, titanium, tantalum, aluminum, and metal nitrides (e.g., titanium nitride and tantalum nitride), for example, the capping oxide layer 140a may be formed of a metal oxide including the same metal element as the upper electrode 135b.

In some embodiments, the top surface of the lower electrode 115a may have a substantially circular shape as illustrated in FIG. 13. The top surfaces of the data storage part 130a and the upper electrode 135b may have circular shapes due to the circular shape of the top surface of the lower electrode 115a. However, the inventive concepts are not limited thereto. In other embodiments, the top surfaces of the lower electrode 115a, the data storage part 130a, and the upper electrode 135b may, for example, have elliptical or polygonal shapes.

Referring still to FIGS. 12 and 13, an area of a bottom surface of the upper electrode 135b may be less than an area of the top surface of the lower electrode 115a. In some embodiments, an entire bottom surface of the upper electrode 135b may overlap a center portion of the top surface of the lower electrode 115a.

In some embodiments, an area of the top surface of the data storage part 130a may also be less than the area of the top surface of the lower electrode 115a. In some embodiments, the area of the bottom surface of the upper electrode 135b may be less than the area of the top surface of the data storage part 130a.

A residue 130r may remain on the lower interlayer insulating layer 105 between the lower electrodes 115a. The residue 130r may include the same material as at least a lower portion of the data storage part 130a.

An upper interlayer insulating layer 155 may cover the lower interlayer insulating layer 105 and the upper electrodes 135b. Upper contact plugs 165 may fill respective upper contact holes 160 formed in the upper interlayer insulating layer 155. The upper contact plugs 165 may be connected to respective ones of the upper electrodes 135b. The top surface of the upper electrode 135b may include a first portion contacting the upper contact plug 165 and a second portion that does not contact the upper contact plug 165. The capping oxide layer 140a may be formed on the second portion of the top surface of the upper electrode 135b.

An interconnection 170 may extend in one direction on the upper interlayer insulating layer 155. The interconnection 170 may be connected to each of the upper contact plugs 165 arranged in that direction. The interconnection 170 may be electrically connected to the data storage parts 130a through the upper contact plugs 165 and the upper electrodes 135b. The interconnection 170 may correspond to a bit line.

In some embodiments, the data storage part 130a may be a magnetic tunnel junction pattern. In this case, the data storage part 130a may include a first magnetic pattern 122a, a tunnel barrier pattern 125a, and a second magnetic pattern 127a that are sequentially stacked. One of the first and second magnetic patterns 122a and 127a may correspond to a reference pattern having a magnetization direction fixed in a direction, and the other of the first and second magnetic patterns 122a and 127a may correspond to a free pattern having a magnetization direction that is changeable between a direction parallel to and a direction anti-parallel to the fixed magnetization direction of the reference pattern.

Referring now to FIG. 14, in some embodiments, a magnetization direction 123P and 127P of the first and second magnetic patterns 122a and 127a may be substantially perpendicular to a contact surface of the tunnel barrier pattern 125a and the second magnetic pattern 127a (or the top surface of the lower electrode 115a). In FIG. 14, the first magnetic pattern 122a corresponds to the reference pattern and the second magnetic pattern 127a corresponds to the free pattern. However, the inventive concepts are not limited thereto. In other embodiments, for example, the first magnetic pattern 122a may correspond to the free pattern and the second magnetic pattern 127a may correspond to the reference pattern.

The first and second magnetic patterns 122a and 127a having the perpendicular magnetization directions 123P and 127P may include at least one of a perpendicular magnetic material (e.g., CoFeTb, CoFeGd, and/or CoFeDy), a perpendicular magnetic material having an L1$_0$ structure, CoPt having a hexagonal close packed (HCP) lattice structure, and a perpendicular magnetic structure. The perpendicular magnetic material having the L1$_0$ structure may include at least one of FePt of the L1$_0$ structure, FePd of the L1$_0$ structure, CoPd of the L1$_0$ structure, or CoPt of the L1$_0$ structure. The perpendicular magnetic structure may include magnetic layers and non-magnetic layers which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n (where n is the number of alternately stacked magnetic layer and non-magnetic layer structures). Here, the reference pattern may be thicker than the free pattern, and/or a coercive force of the reference pattern may be greater than a coercive force of the free pattern.

In other embodiments, as illustrated in FIG. 15, magnetization directions 123H and 127H of first and second magnetic patterns 122a and 127a may be substantially parallel to the contact surface of the tunnel barrier pattern 125a and the second magnetic pattern 127a (or the top surface of the lower electrode 115a). FIG. 15 illustrates, for example, the first magnetic pattern 122a corresponding to the reference pattern and the second magnetic pattern 127a corresponding to the free pattern. The first and second magnetic patterns 122a and 127a having the magnetization directions 123H and 127H may include a ferromagnetic material. The reference pattern may further include an antiferromagnetic material for pinning a magnetization direction of the ferromagnetic material included in the reference pattern.

The tunnel barrier pattern 125a may, for example, include at least one of magnesium oxide (MgO), titanium oxide (TiO), aluminum oxide (AlO), magnesium-zinc oxide (MgZnO), or magnesium-boron oxide (MgBO).

The magnetization direction of the free pattern in the data storage part 130a may be changed by spin torque of electrons in a program current.

In the aforementioned embodiments, the data storage part 130a may be magnetic tunnel junction pattern. However, the inventive concepts are not limited thereto. In other embodiments of the inventive concepts, the data storage part 130a may include a transition metal oxide. At least one electrical path may be generated in or removed from the transition metal oxide by a program or erase operation, respectively. The electrical path may, for example, be vacancies connected to each other or metal atoms connected to each other. Thus, the transition metal oxide may store logic data using a resistance variation of the transition metal oxide. The transition metal oxide may include at least one of niobium oxide, titanium oxide, nickel oxide, zirconium oxide, vanadium oxide, PCMO((Pr,Ca)Mn03), strontium-titanium oxide, barium-strontium-titanium oxide, strontium-zirconium oxide, barium-zirconium oxide, or barium-strontium-zirconium oxide.

The semiconductor device described above may, for example, be implemented in a semiconductor memory device having the data storage parts 130a. However, the inventive concepts are not limited thereto. In other embodiments, the semiconductor device according to the inventive concepts may be realized as a logic device or a system-on-chip (SoC).

The semiconductor devices in the embodiments described above may further be encapsulated using various packaging techniques. For example, the semiconductor devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which a semiconductor device constructed according to one of the above embodiments is mounted may further include a controller and/or a logic device controlling the semiconductor device.

Figure 16:
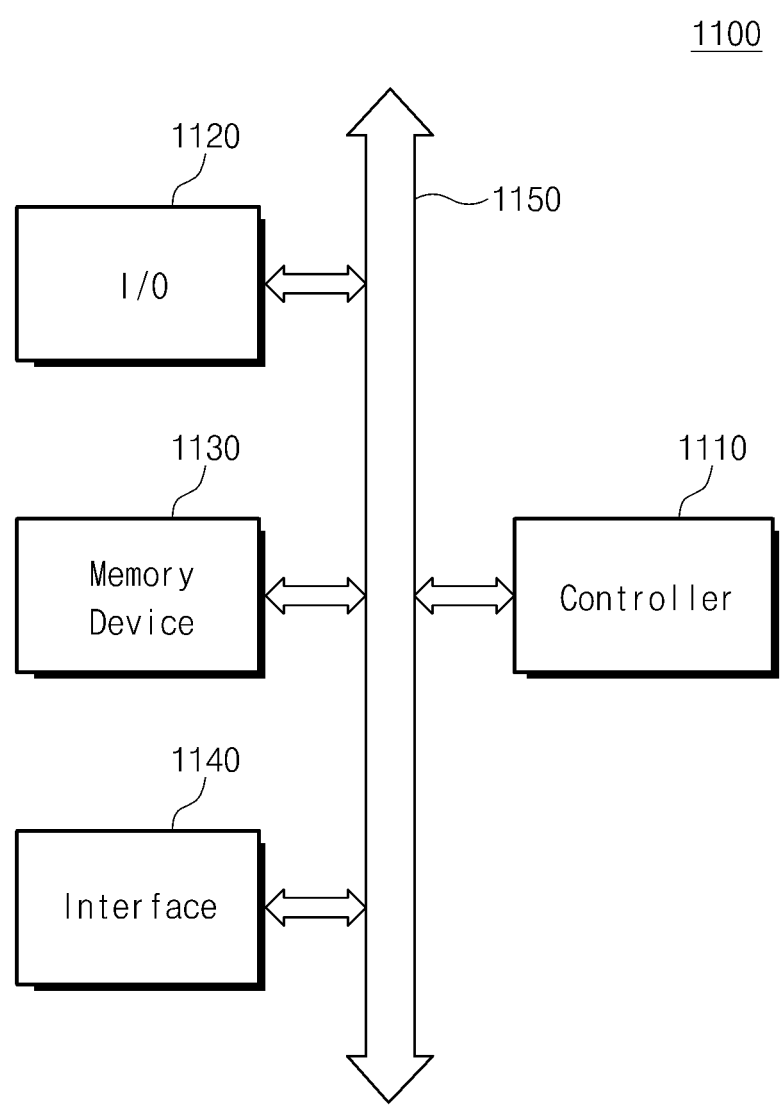
FIG. 16 is a schematic block diagram illustrating an electronic system including semiconductor devices constructed according to example embodiments of the inventive concepts.

FIG. 16 is a schematic block diagram illustrating an example of an electronic system including one or more semiconductor devices constructed according to example embodiments of the inventive concepts.

Referring to FIG. 16, an electronic system 1100 according to an embodiment incorporating the inventive concepts may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or other logic devices having a similar function to any one of the microprocessor, the digital signal processor, and the microcontroller. The I/O unit 1120 may include a keypad, a keyboard, and/or a display unit. The memory device 1130 may store data and/or commands. If the semiconductor devices constructed according to the aforementioned embodiments are implemented in semiconductor memory devices, the memory device 1130 may include at least one of the semiconductor devices constructed according to the embodiments described above. The interface unit 1140 may transmit electrical data to a communication network or may receive electrical data from a communication network. The interface unit 1140 may operate wirelessly or through a cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may, for example, be applied to a personal digital assistant (PDA), a portable computer, a web tablet, a wireless phone, a mobile phone, a digital music player, a memory card, or other electronic products. The other electronic products may receive or transmit information data by wireless communication.

Figure 17:
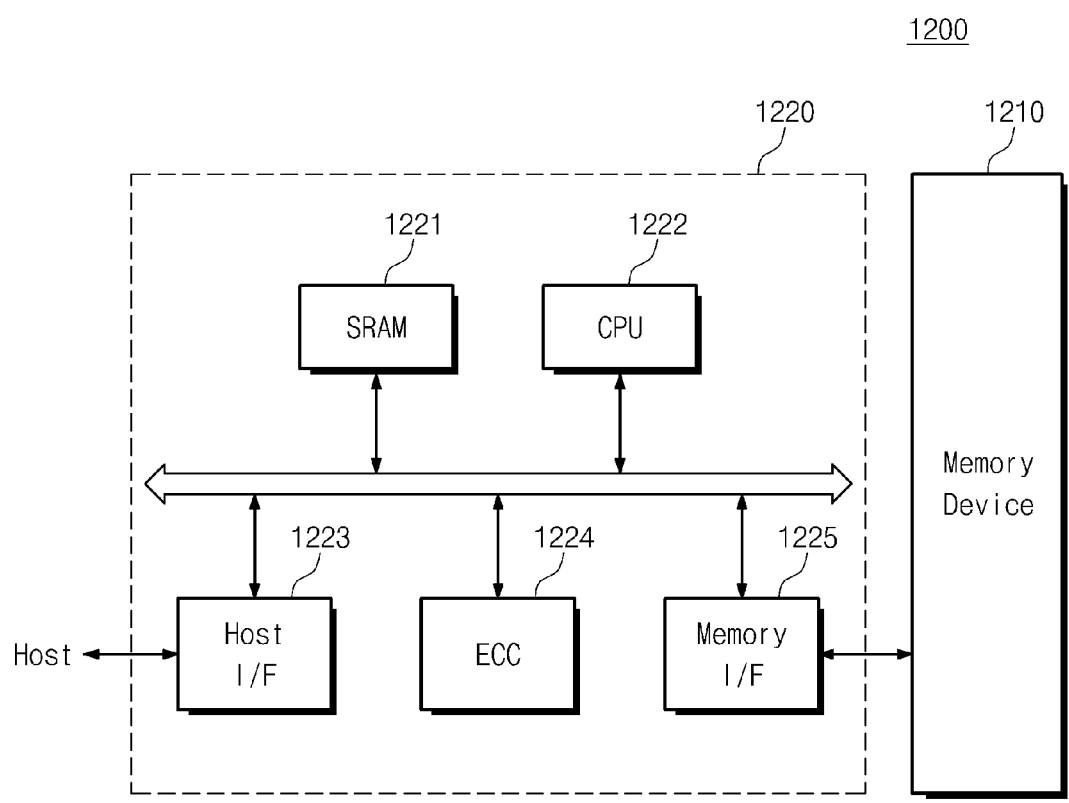
FIG. 17 is a schematic block diagram illustrating a memory card including semiconductor devices constructed according to example embodiments of the inventive concepts.

FIG. 17 is a schematic block diagram illustrating an example of memory cards including semiconductor devices constructed according to example embodiments of the inventive concepts.

Referring to FIG. 17, a memory card 1200 constructed according to an embodiment of the inventive concepts may include a memory device 1210. If the semiconductor devices according to the aforementioned embodiments are semiconductor memory devices, the memory device 1210 may include at least one of the semiconductor devices constructed according to the embodiments mentioned above. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may realized as a solid state disk (SSD) which may be used as a hard disk of a computer system.

In summary, according to embodiments of the inventive concepts, the upper conductive layer may be formed to cover the top surface and at least a portion of the sidewall of the lower electrode, and a selective oxidation process may be performed to form the capping oxide layer on the first surface of the upper conductive layer. The upper conductive layer may be etched through the second surface of the upper conductive layer, thereby forming the upper electrode on the top surface of the lower electrode. Since the capping oxide layer may be used as an etch mask when the upper conductive layer is etched, the upper electrode may be formed to have sufficient thickness to perform its desired functions. Thus, the upper electrode may sufficiently operate as an electrode.

Additionally, the selective oxidation process may be an anisotropic oxidation process. Thus, the formation process of the capping oxide layer may be simplified to improve the productivity of the semiconductor device manufacturing processes. For example, due to the anisotropic oxidation process, the capping oxide layer may be formed to be self-aligned without a photolithography process.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but are merely illustrative. Thus, the scope of the inventive concepts is to be determined according to the broadest permissible interpretation of the following claims and their equivalents, and shall not be restricted or limited by the foregoing description.

What is claimed is:

1. A method of manufacturing a semiconductor device, the method comprising:
   forming a material layer on a substrate;
   performing a selective oxidation process on an exposed surface of the material layer, wherein the exposed surface of the material layer comprises a first surface and a second surface, and wherein the first surface of the material layer is selectively oxidized to form a capping oxide layer and the second surface of the material layer is not oxidized during the selective oxidation process;
   etching the material layer through the second surface of the material layer using the capping oxide layer as an etch mask to form a material pattern;
   forming a lower pattern on the substrate before forming the material layer,
   wherein the material layer is formed to cover a top surface and at least a portion of a sidewall of the lower pattern;
   wherein the first surface of the material layer covers the top surface of the lower pattern;
   wherein the second surface of the material layer covers at least a portion of the sidewall of the lower pattern; and
   wherein the material pattern is formed on the top surface of the lower pattern.

2. The method of claim 1, wherein the material layer on the top surface of the lower pattern is thicker than the material layer on the sidewall of the lower pattern.

3. The method of claim 1, wherein the selective oxidation process is an anisotropic oxidation process having a specific oxidation direction; and
   wherein the first surface of the material layer is exposed in the specific oxidation direction and the second surface of the material layer is not exposed in the specific oxidation direction in the selective oxidation process.

4. The method of claim 1, wherein the material layer is etched by an isotropic etching process.

5. The method of claim 4, wherein the isotropic etching process is a wet etching process.

6. A method of manufacturing a semiconductor device, the method comprising:
   forming a lower electrode on a substrate;
   forming a conductive layer having a first surface covering a top surface of the lower electrode and a second surface covering at least a portion of a sidewall of the lower electrode;
   performing a selective oxidation process to form a capping oxide layer on a first surface of the conductive layer, wherein a second surface of the conductive layer is not oxidized; and
   etching the conductive layer through the second surface of the conductive layer to form an upper electrode on the top surface of the lower electrode,
   wherein an etch rate of the capping oxide layer is less than an etch rate of the conductive layer when the conductive layer is etched.

7. The method of claim 6, wherein the selective oxidation process is an anisotropic oxidation process having an oxidation direction substantially perpendicular to a top surface of the substrate.

8. The method of claim 7, wherein the anisotropic oxidation process includes at least one of an anisotropic plasma oxidation process or an anisotropic thermal oxidation process.

9. The method of claim 6, wherein the conductive layer is etched by an isotropic etching process.

10. The method of claim 9, wherein the isotropic etching process is a wet etching process.

11. The method of claim 6, further comprising:
    forming a data storage layer covering the top surface and at least a portion of the sidewall of the lower electrode before forming the conductive layer,
    wherein the conductive layer is formed on the data storage layer.

12. The method of claim 11, further comprising:
forming a protection insulating spacer surrounding the sidewall of the lower electrode before forming the data storage layer.

13. The method of claim 12, wherein forming the protection insulating spacer comprises:
conformally forming a protection insulating layer on the substrate having the lower electrode; and
performing an etch-back process on the protection insulating layer to form the protection insulating spacer.

14. The method of claim 11, wherein the data storage layer includes a first magnetic layer, a tunnel barrier layer, and a second magnetic layer that are sequentially stacked; and
wherein one of the first and second magnetic layers has a magnetization direction fixed in one direction, and the other of the first and second magnetic layers has a magnetization direction changeable between a parallel direction and an anti-parallel direction with respect to the fixed magnetization direction.

15. The method of claim 11, further comprising:
etching the data storage layer disposed on the sidewall of the lower electrode to form a data storage part after forming the upper electrode.

16. The method of claim 15, wherein the data storage layer is etched by an anisotropic etching process having a tilted etching direction with respect to a top surface of the substrate.

17. The method of claim 6, wherein the conductive layer on the top surface of the lower electrode is thicker than the conductive layer on the sidewall of the lower electrode.

18. The method of claim 6, wherein the conductive layer is a metal containing layer; and
wherein the conductive layer is etched using an etchant having a pH of between about 5 to about 7.

* * * * *